(12) United States Patent
Ma et al.

(10) Patent No.: US 11,367,698 B2
(45) Date of Patent: Jun. 21, 2022

(54) METHOD OF BONDING INTEGRATED CIRCUIT CHIP TO DISPLAY PANEL, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Hongwei Ma, Beijing (CN); Youngyik Ko, Beijing (CN); Tairong Kim, Beijing (CN); Xiangdan Dong, Beijing (CN); Jinsan Park, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 648 days.

(21) Appl. No.: 16/332,291

(22) PCT Filed: Oct. 15, 2018

(86) PCT No.: PCT/CN2018/110229
§ 371 (c)(1),
(2) Date: Mar. 11, 2019

(87) PCT Pub. No.: WO2019/080736
PCT Pub. Date: May 2, 2019

(65) Prior Publication Data
US 2021/0384149 A1 Dec. 9, 2021

(30) Foreign Application Priority Data
Oct. 27, 2017 (CN) .......................... 201711057011.3

(51) Int. Cl.
*H01L 23/00* (2006.01)
*G02F 1/1345* (2006.01)
(Continued)

(52) U.S. Cl.
CPC .......... *H01L 24/02* (2013.01); *G02F 1/13452* (2013.01); *H01L 24/08* (2013.01);
(Continued)

(58) Field of Classification Search
CPC ..... H01L 24/02; H01L 24/08; H01L 25/0657; H01L 25/18; H01L 25/50; H01L 27/3276;
(Continued)

(56) References Cited

U.S. PATENT DOCUMENTS

2006/0097364 A1* 5/2006 Shinojima ........... G02F 1/13452
257/666
2013/0175528 A1 7/2013 Han et al.
(Continued)

FOREIGN PATENT DOCUMENTS

| CN | 106271107 A | 1/2017 |
|---|---|---|
| CN | 106973520 A | 7/2017 |

(Continued)

OTHER PUBLICATIONS

First Office Action in the Chinese Patent Application No. 201711057011.3, dated Sep. 2, 2019; English translation attached.
(Continued)

*Primary Examiner* — Dao H Nguyen
(74) *Attorney, Agent, or Firm* — Intellectual Valley Law, P.C.

(57) ABSTRACT

The present application provides a method of bonding an integrated circuit chip to a display panel. The method includes forming a plurality of first bonding pads in a bonding region on a first side of the display panel; forming a plurality of vias extending through the display panel in the bonding region; subsequent to forming the plurality of vias, disposing an integrated circuit chip having a plurality of second bonding pads on a second side of the display panel substantially opposite to the first side, the plurality of second
(Continued)

bonding pads being on a side of the integrated circuit chip proximal to the display panel; and electrically connecting the plurality of first bonding pads respectively with the plurality of second bonding pads by forming a plurality of connectors respectively in the plurality of vias.

18 Claims, 9 Drawing Sheets

(51) Int. Cl.
  *H01L 25/065* (2006.01)
  *H01L 25/18* (2006.01)
  *H01L 25/00* (2006.01)
  *H01L 27/32* (2006.01)
(52) U.S. Cl.
  CPC .......... *H01L 25/0657* (2013.01); *H01L 25/18* (2013.01); *H01L 25/50* (2013.01); *H01L 27/3276* (2013.01); *H01L 2224/02311* (2013.01); *H01L 2224/02371* (2013.01); *H01L 2224/02372* (2013.01); *H01L 2224/02381* (2013.01); *H01L 2224/081* (2013.01); *H01L 2225/06544* (2013.01)
(58) Field of Classification Search
  CPC . H01L 2224/02311; H01L 2224/02371; H01L 2224/02372; H01L 2224/02381; H01L 2224/081; H01L 2225/06544; G02F 1/13452

USPC ........................................................ 257/774
See application file for complete search history.

(56) References Cited

U.S. PATENT DOCUMENTS

| 2017/0170255 A1* | 6/2017 | Ha ....................... H01L 27/3276 |
| 2017/0171990 A1 | 6/2017 | Kim et al. |
| 2018/0146578 A1* | 5/2018 | Lee ................... G02F 1/133305 |
| 2019/0101782 A1* | 4/2019 | Cao ..................... G02F 1/13452 |

FOREIGN PATENT DOCUMENTS

| CN | 107037647 A | 8/2017 |
| CN | 107039377 A | 8/2017 |
| CN | 107093606 A | 8/2017 |
| JP | 2001156112 A | 6/2001 |

OTHER PUBLICATIONS

International Search Report & Written Opinion dated Jan. 14, 2019, regarding PCT/CN2018/110229.
The Extended European Search Report in the European Patent Application No. 18852765.9, dated Jul. 19, 2021.

\* cited by examiner

METHOD OF BONDING INTEGRATED
CIRCUIT CHIP TO DISPLAY PANEL, AND
DISPLAY APPARATUS

CROSS-REFERENCE TO RELATED
APPLICATION

This application is a national stage application under 35 U.S.C. § 371 of International Application No. PCT/CN2018/110229, filed Oct. 15, 2018, which claims priority to Chinese Patent Application No. 201711057011.3, filed Oct. 27, 2017, the contents of which are incorporated by reference in the entirety.

TECHNICAL FIELD

The present invention relates to display technology, more particularly, to a method of bonding an integrated circuit chip to a display panel, and a display apparatus.

BACKGROUND

In recent years, flexible display apparatuses have been developed. In particular, flexible organic light emitting diode display apparatuses have been widely used in various applications. To achieve better user experience and display quality, a narrow bezel design of display apparatuses has become a focus of research and development.

SUMMARY

In one aspect, the present invention provides a method of bonding an integrated circuit chip to a display panel, comprising forming a plurality of first bonding pads in a bonding region on a first side of the display panel; forming a plurality of vias extending through the display panel in the bonding region; subsequent to forming the plurality of vias, disposing an integrated circuit chip having a plurality of second bonding pads on a second side of the display panel substantially opposite to the first side, the plurality of second bonding pads being on a side of the integrated circuit chip proximal to the display panel; and electrically connecting the plurality of first bonding pads respectively with the plurality of second bonding pads by forming a plurality of connectors respectively in the plurality of vias.

Optionally, the one or more of the plurality of vias extends through one of the plurality of first bonding pads.

Optionally, the one or more of the plurality of vias directly abut an edge of one of the plurality of first bonding pads.

Optionally, the method further comprises, prior to forming the plurality of via, forming an optical film on a second side of the display panel substantially opposite to the first side; and wherein the plurality of vias are formed to extend through the display panel and the optical film in the bonding region.

Optionally, the method further comprises subsequent to forming the optical film, forming a protective film on a side of the optical film distal to the display panel; and subsequent to forming the plurality of vias, removing the protective film from the optical film.

Optionally, one or more of the plurality of vias extend through the display panel and the optical film in the bonding region, and at least partially extend into the protective film.

Optionally, prior to forming the plurality of vias, an orthographic projection of each of the plurality of first bonding pads on the display panel at least partially overlaps with an orthographic projection of one of the plurality of second bonding pads on the display panel, thereby forming an overlapping region.

Optionally, each of the plurality of vias are formed at least partially in the overlapping region.

Optionally, each of the plurality of vias are formed at least partially in the overlapping region, and adjacent to an edge of the overlapping region.

Optionally, each of the plurality of vias are formed at least partially in the overlapping region, and directly abutting an edge of the overlapping region.

Optionally, each of the plurality of vias are formed outside the overlapping region, and directly abutting an edge of the overlapping region.

Optionally, forming the plurality of vias are performed by laser perforation.

Optionally, forming the plurality of connectors respectively in the plurality of vias are performed by sputtering a conductive material in the the plurality of vias.

Optionally, subsequent to disposing the integrated circuit chip having the plurality of second bonding pads on the second side of the display panel, further comprising aligning the plurality of first bonding pads and the plurality of second bonding pads with each other so that an orthographic projection of each of the plurality of first bonding pads on the display panel at least partially overlaps with an orthographic projection of one of the plurality of second bonding pads on the display panel.

Optionally, an orifice of at least one of the plurality of vias on the first side is surrounded by one of the plurality of first bonding pads.

Optionally, an orifice of one of the plurality of vias on the first side directly abuts one of the plurality of first bonding pads.

Optionally, the integrated circuit chip is a chip-on-film.

In another aspect, the present invention provides a display apparatus comprising a display panel and an integrated circuit chip bonded to the display panel according to a method described herein.

Optionally, the display apparatus is a flexible display apparatus.

Optionally, the integrated circuit chip is a chip-on-film.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
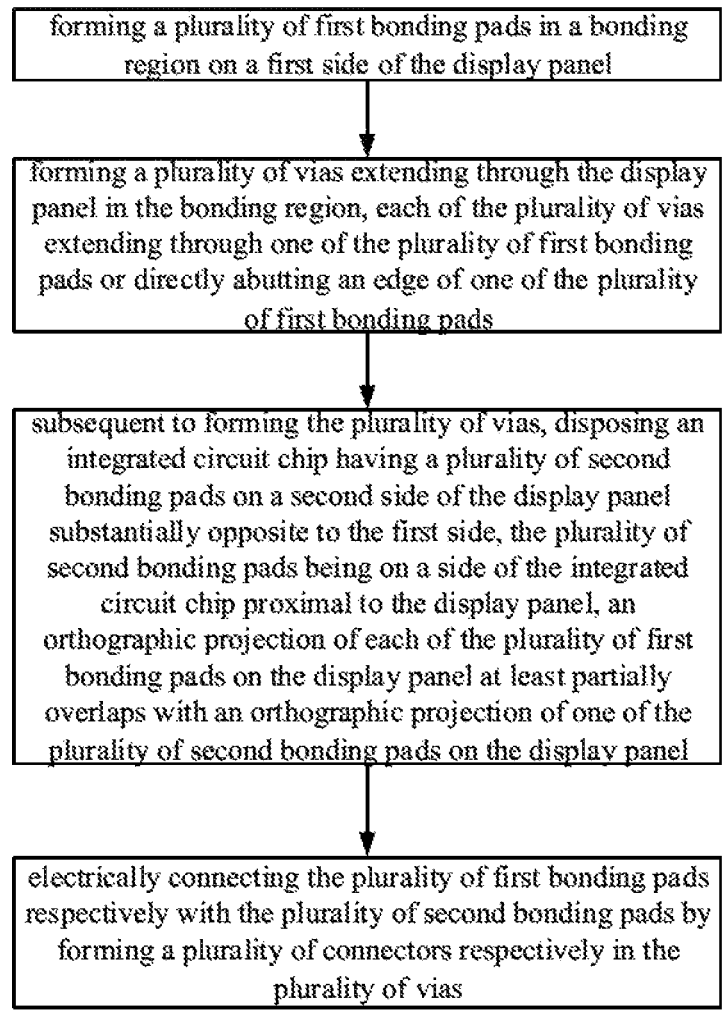
FIG. 1 is a flow chart illustrating a method of bonding an integrated circuit chip to a display panel in some embodiments according to the present disclosure.

The present disclosure provides, inter alia, a method of bonding an integrated circuit chip to a display panel, and a display apparatus that substantially obviate one or more of the problems due to limitations and disadvantages of the related art. In one aspect, the present disclosure provides a method of bonding an integrated circuit chip to a display panel having a display region and a bonding region. FIG. 1 is a flow chart illustrating a method of bonding an integrated circuit chip to a display panel in some embodiments according to the present disclosure. Referring to FIG. 1, the method in some embodiments includes forming a plurality of first bonding pads in a bonding region on a first side of the display panel; forming a plurality of vias extending through the display panel in the bonding region, each of the plurality of vias extending through one of the plurality of first bonding pads or directly abutting an edge of one of the plurality of first bonding pads; subsequent to forming the plurality of vias, disposing an integrated circuit chip having a plurality of second bonding pads on a second side of the display panel substantially opposite to the first side, the plurality of second bonding pads being on a side of the integrated circuit chip proximal to the display panel, an orthographic projection of each of the plurality of first bonding pads on the display panel at least partially overlaps with an orthographic projection of one of the plurality of second bonding pads on the display panel; and electrically connecting the plurality of first bonding pads respectively with the plurality of second bonding pads by forming a plurality of connectors respectively in the plurality of vias. Optionally, the integrated circuit chip is a chip-on-film.

As used herein, the term "display region" refers to a region of the display panel where image is actually displayed. Optionally, the display region may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels. As used herein, the term "bonding region" refers to a region of the display panel wherein a plurality of signal lines are connected to an integrated circuit ship. Optionally, the bonding region of the display panel includes a plurality of bonding pads. As used herein, the term "substantially opposite" means that two sides (e.g., a first side and a second side) need not be arranged exactly in parallel, but may be arranged in such a manner that an inclination between the two sides is defined, e.g., with an inclined angle less than 45 degrees, 30 degrees, 15 degrees, or 10 degrees.

In the present method, the plurality of vias are first formed in a plurality of pre-designated positions prior to disposing the integrated circuit chip on the second side of the display panel, followed by forming the plurality of connectors respectively in the plurality of vias respectively electrically connecting the plurality of first bonding pads and the plurality of second bonding pads. Because the plurality of vias are formed prior to placing the integrated circuit chip on the display panel, obviating any damage to the integrated circuit chip caused by the via-forming process (e.g., using laser to form the plurality of vias).

Figure 2:
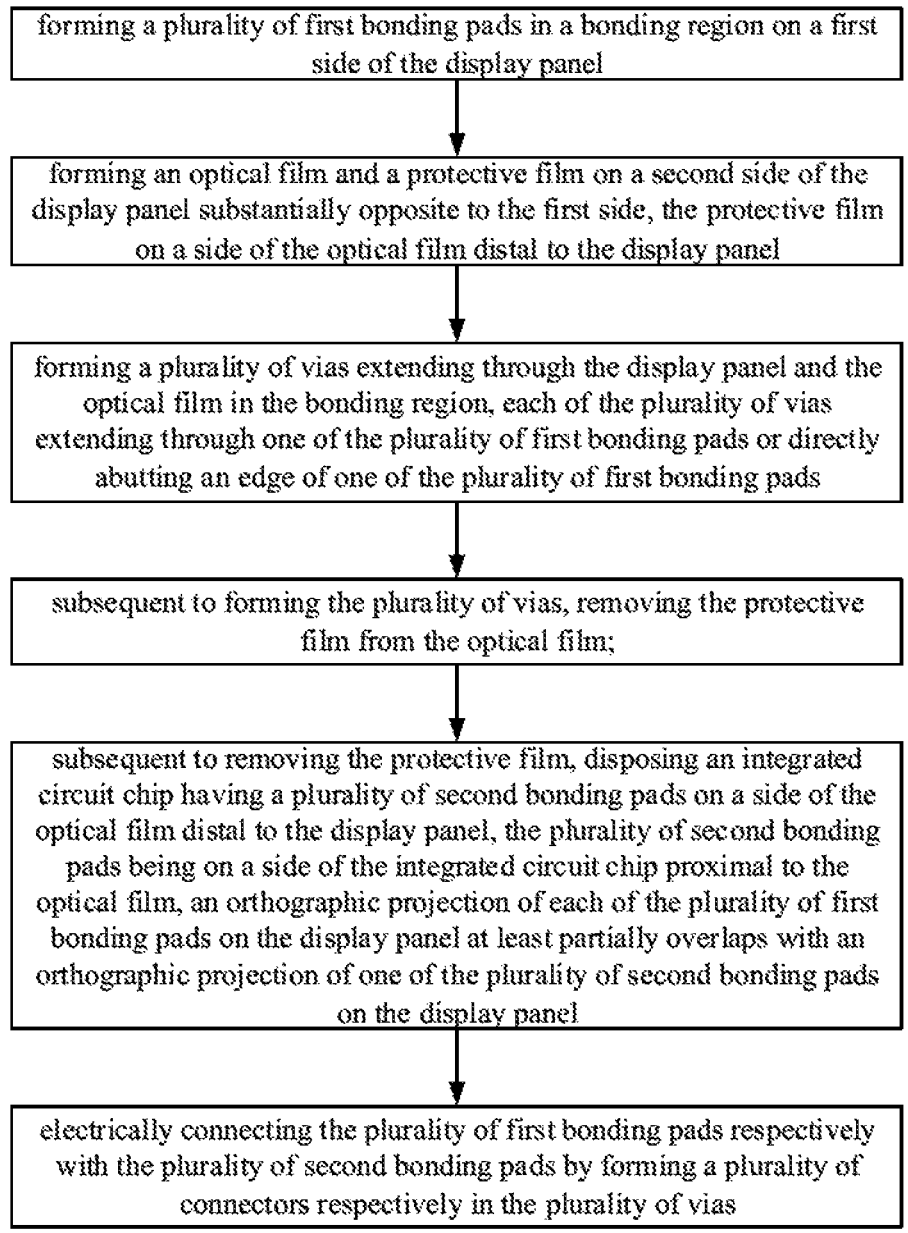
FIG. 2 is a flow chart illustrating a method of bonding an integrated circuit chip to a display panel in some embodiments according to the present disclosure.

FIG. 2 is a flow chart illustrating a method of bonding an integrated circuit chip to a display panel in some embodiments according to the present disclosure. Referring to FIG. 2, the method in some embodiments includes forming a plurality of first bonding pads in a bonding region on a first side of the display panel; forming an optical film and a protective film on a second side of the display panel substantially opposite to the first side, the protective film on a side of the optical film distal to the display panel; forming a plurality of vias extending through the display panel and the optical film in the bonding region, each of the plurality of vims extending through one of the plurality of first bonding pads or directly abutting an edge of one of the plurality of first bonding pads; subsequent to forming the plurality of vias, removing the protective film from the optical film; subsequent to removing the protective film, disposing an integrated circuit chip having a plurality of second bonding pads on aside of the optical film distal to the display panel, the plurality of second bonding pads being on a side of the integrated circuit chip proximal to the optical film, an orthographic projection of each of the plurality of first bonding pads on the display panel at least partially overlaps with an orthographic projection of one of the plurality of second bonding pads on the display panel; and electrically connecting the plurality of first bonding pads respectively with the plurality of second bonding pads by forming a plurality of connectors respectively in the plurality of vias. Optionally, the plurality of vias are formed by laser perforation.

Optionally, one or more of the plurality of vias not only extend through the display panel and the optical film in the bonding region, but also at least partially extend into the protective film. Optionally, the plurality of vias extend through the display panel, the optical film, and the protective film in the bonding region.

In some embodiments, each of the plurality of vias extend through one of the plurality of first bonding pads or directly abutting an edge of one of the plurality of first bonding pads. Optionally, an orifice of one of the plurality of vias on the first side is surrounded by one of the plurality of first bonding pads. Optionally, an orifice of one of the plurality of vias on the first side directly abuts one of the plurality of first bonding pads.

In some embodiment, the protective film is required. Optionally, the method in some embodiments includes forming a plurality of first bonding pads in a bonding region on a first side of the display panel; forming an optical film on a second side of the display panel substantially opposite to the first side; forming a plurality of vias extending through the display panel in the bonding region and the optical film, each of the plurality of vias extending through one of the plurality of first bonding pads or directly abutting an edge of one of the plurality of first bonding pads; subsequent to forming the plurality of vias, disposing an integrated circuit chip having a plurality of second bonding pads on a side of the optical film distal to the display panel, the plurality of second bonding pads being on a side of the integrated circuit chip proximal to the optical film, an orthographic projection of each of the plurality of first bonding pads on the display panel at least partially overlaps with an orthographic projection of one of the plurality of second bonding pads on the display panel; and electrically connecting the plurality of first bonding pads respectively with the plurality of second bonding pads by forming a plurality of connectors respectively in the plurality of vias.

Figure 3:
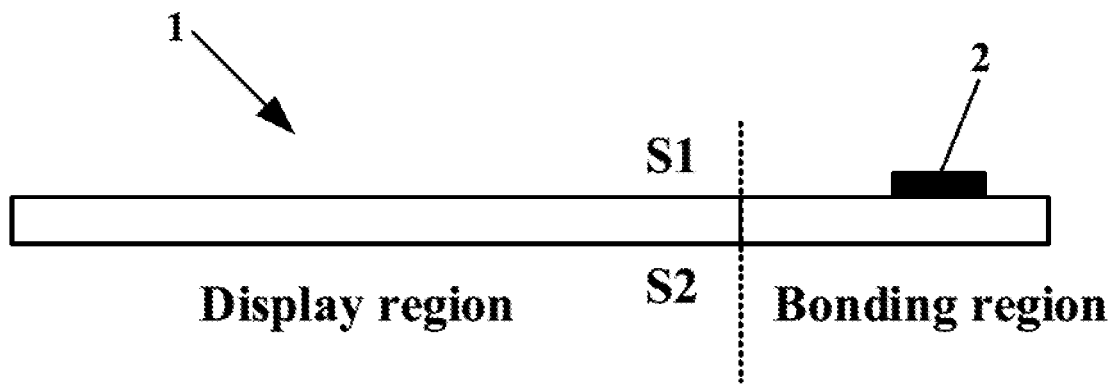
FIG. 3 is a schematic diagram illustrating the structure of a display panel in some embodiments according to the present disclosure.
Figure 4:
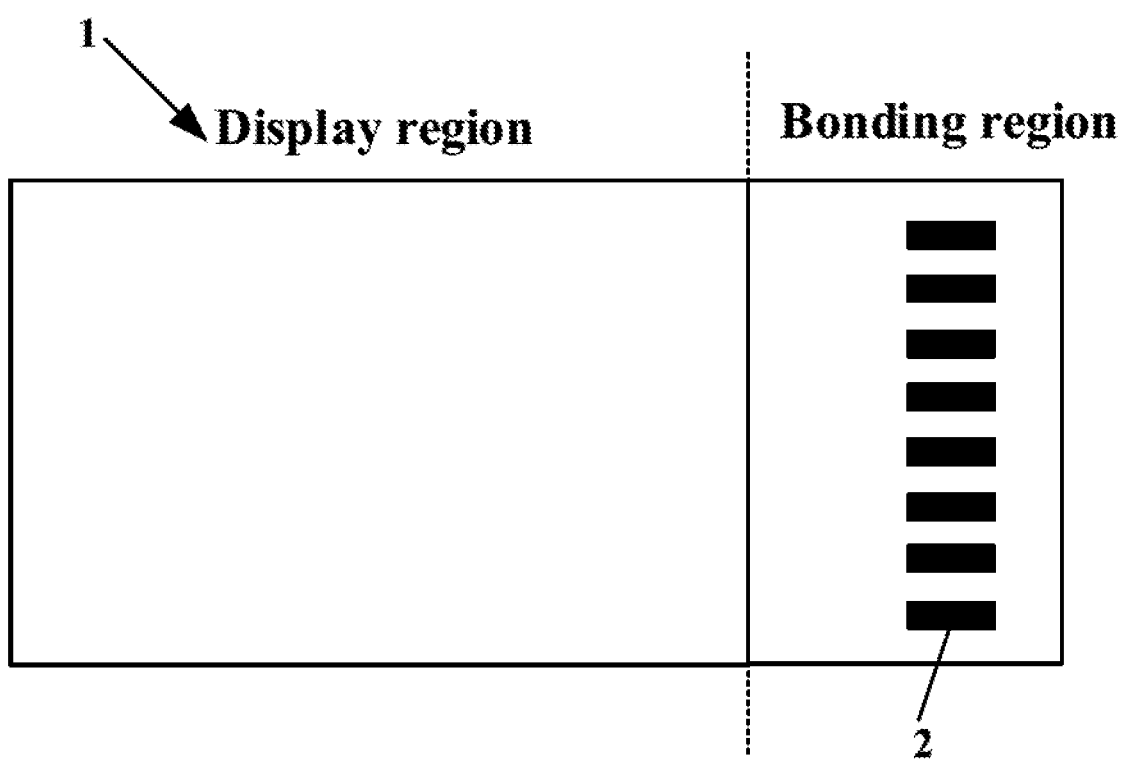
FIG. 4 is a plan view of the display panel in FIG. 3.

FIG. 3 is a schematic diagram illustrating the structure of a display panel in some embodiments according to the present disclosure. FIG. 4 is a plan view of the display panel in FIG. 3. Referring to FIG. 3 and FIG. 4, the display panel 1 has a display region and a bonding region. In the bonding region, the display panel 1 includes a plurality of first bonding pads 2. The display panel has a first side S1 and a second side S2 substantially opposite to the first side S1. The plurality of bonding pads are on the first side S1. Optionally, the first side S1 is a light emitting side of the display panel 1, whereas the second side S2 is a light non-emitting side of the display panel 1.

Figure 5:
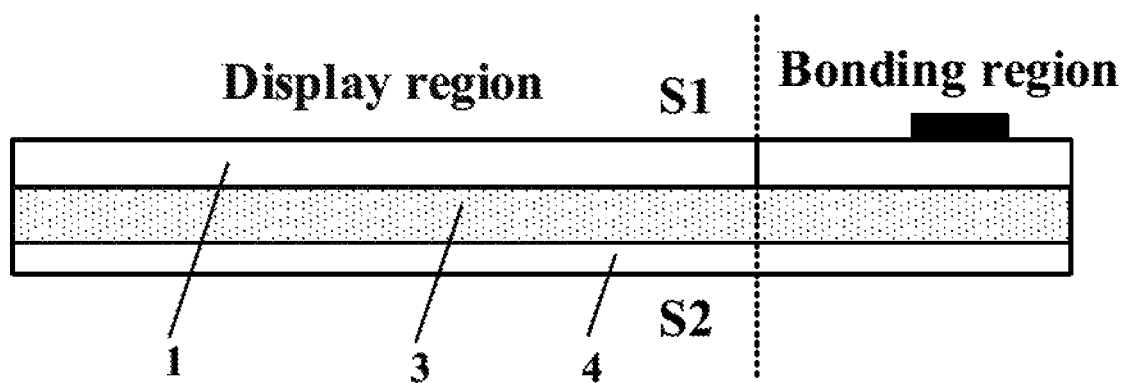
FIG. 5 illustrates a process of forming an optical film on a display panel in some embodiments according to the present disclosure.

FIG. 5 illustrates a process of forming an optical film on a display panel in some embodiments according to the present disclosure. Referring to FIG. 5, an optical film 3 and a protective film 4 are formed on the second side S2 of the display panel 1. The protective film 4 is formed on a side of the optical film 3 distal to the display panel 1. Optionally, the optical film 3 is in direct contact with the display panel 1, and the protective film 4 is in direction contact with the optical film 3. Optionally, the optical film 3 is attached to the display panel by an optically adhesive film.

Optionally, the optical film 3 extends throughout the display panel 1. Optionally, the protective film 4 extends throughout the display panel 1. Optionally, the protective film 4 is limited to the bonding region of the display panel 1. Optionally, the protective film 4 is omitted entirely, i.e., only the optical film 3 is disposed on the second side S2 of the display panel 1.

Figure 6A:
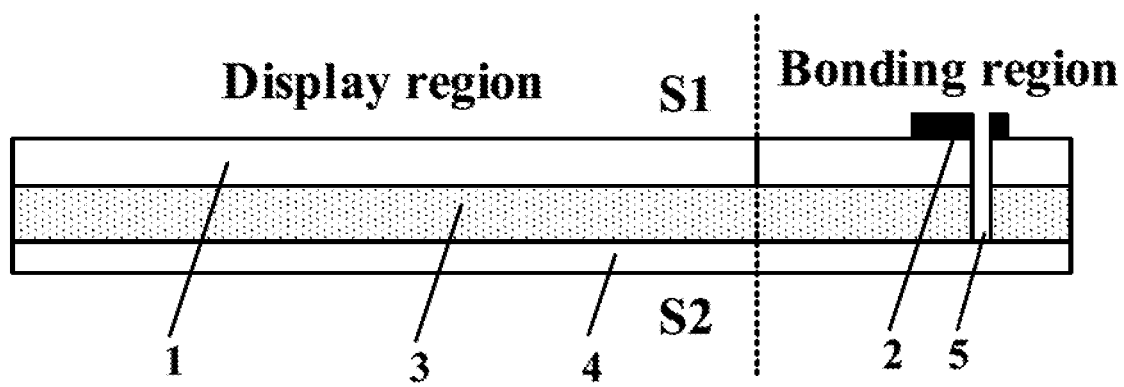
FIG. 6A illustrates a process of forming a plurality of vias in a bonding region of a display panel in some embodiments according to the present disclosure.

FIG. 6A illustrates a process of forming a plurality of vias in a bonding region of a display panel in some embodiments according to the present disclosure. Referring to FIG. 6A, the plurality of vias 5 respectively extend through the plurality of first bonding pads 2. Each of the pre-designated positions for forming the plurality of vias 5 is adjacent to an edge of one of the plurality of first bonding pads 2. Optionally, the plurality of vias 5 extend through an entire thickness of the display panel 1 and the optical film 3, as shown in FIG. 6A. Optionally, the plurality of vias 5 do not extend into the protective film 4. Optionally, the plurality of vias 5 at least partially extend into the protective film 4.

Figure 6B:
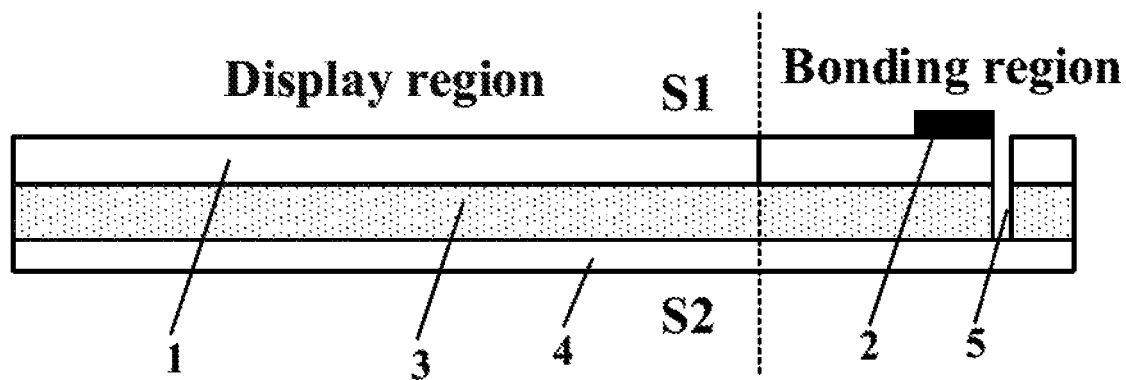
FIG. 6B illustrates a process of forming a plurality of vias in a bonding region of a display panel in some embodiments according to the present disclosure.

FIG. 6B illustrates a process of forming a plurality of vias in a bonding region of a display panel in some embodiments according to the present disclosure. Referring to FIG. 6B, each of the plurality of vias 5 is directly abutting an edge of one of the plurality of first bonding pads 2. The step of forming the plurality of vias 5 includes removing a portion of each of the plurality of first bonding pads 2 at its edge. Each of the pre-designated positions for forming the plurality of vias 5 is at an edge of one of the plurality of first bonding pads 2. Optionally, the plurality of vias 5 extend through an entire thickness of the display panel 1 and the optical film 3, as shown in FIG. 6B. Optionally, the plurality of vias 5 do not extend into the protective film 4. Optionally, the plurality of vias 5 at least partially extend into the protective film 4.

Figure 6C:
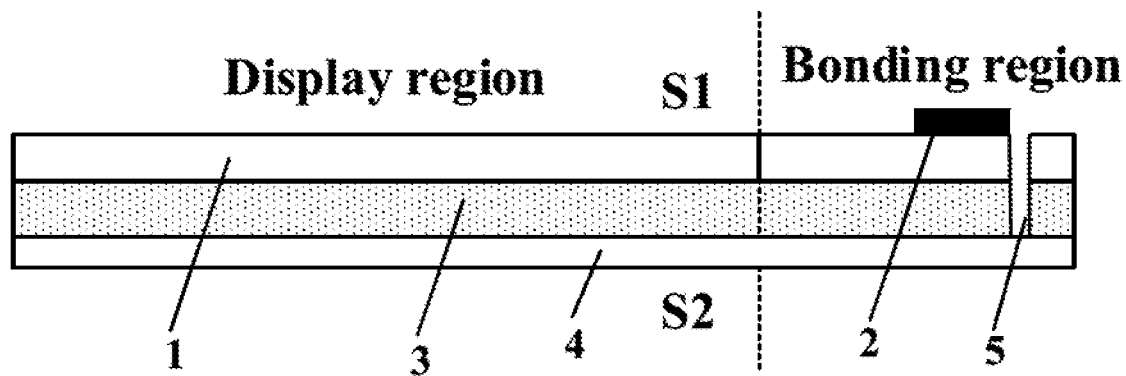
FIG. 6C illustrates a process of forming a plurality of vias in a bonding region of a display panel in some embodiments according to the present disclosure.

FIG. 6C illustrates a process of forming a plurality of vias in a bonding region of a display panel in some embodiments according to the present disclosure. Referring to FIG. 6C, each of the plurality of vias 5 is directly abutting an edge of one of the plurality of first bonding pads 2. The step of forming the plurality of vias 5 does not involve removing any portion of the plurality of first bonding pads 2. Each of the pre-designated positions for forming the plurality of vias 5 is directly abutting an edge of one of the plurality of first bonding pads 2. Optionally, the plurality of vias 5 extend through an entire thickness of the display panel 1 and the optical film 3, as shown in FIG. 6C. Optionally, the plurality of vias 5 do not extend into the protective film 4. Optionally, the plurality of vias 5 at least partially extend into the protective film 4.

Optionally, the step of forming the plurality of vias 5 is performed by laser perforation.

Figure 7:
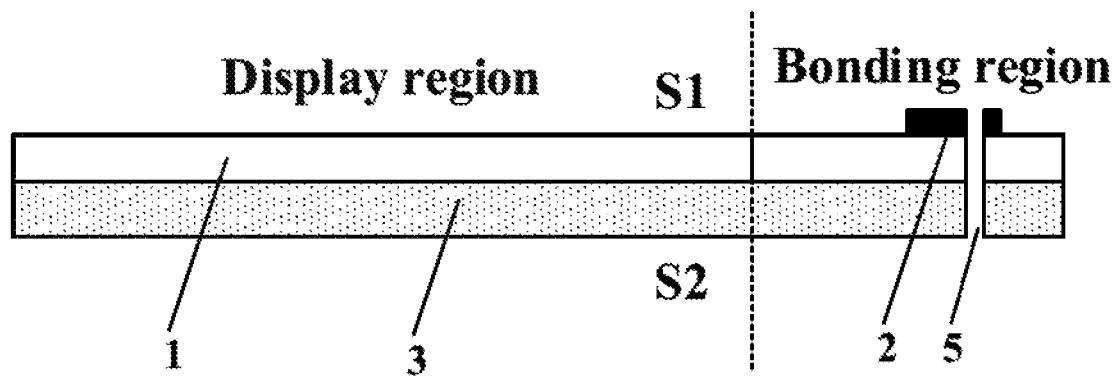
FIG. 7 illustrates a process of removing a protective film from a display panel in some embodiments according to the present disclosure.

FIG. 7 illustrates a process of removing a protective film from a display panel in some embodiments according to the present disclosure. Referring to FIG. 7, subsequent to forming the plurality of vias, the protective film 4 is removed from the surface of the optical film 3.

Figure 8:
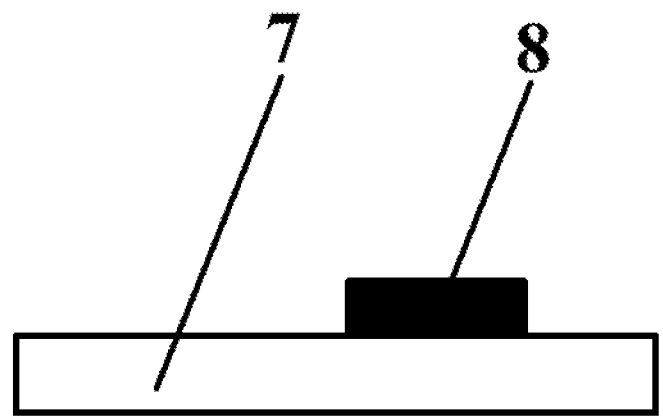
FIG. 8 is a schematic diagram illustrating the structure of an integrated circuit chip in some embodiments according to the present disclosure.
Figure 9:
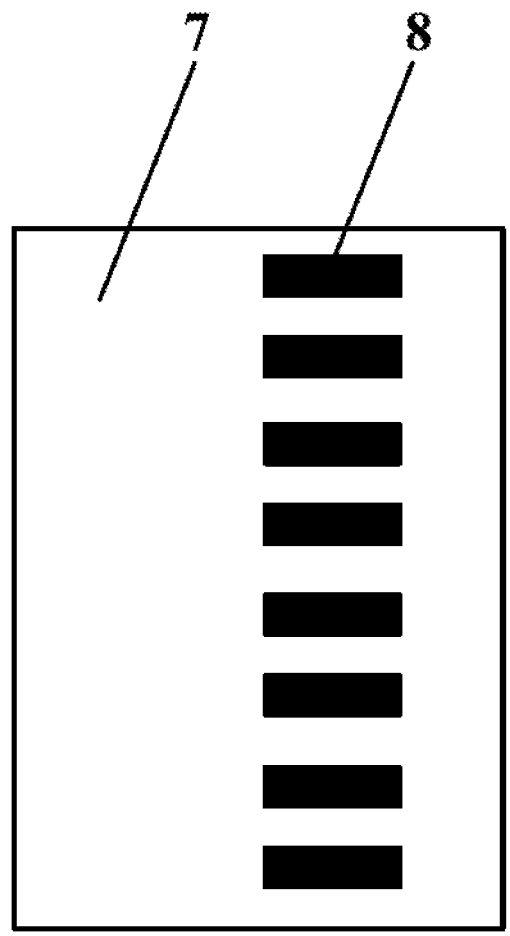
FIG. 9 is a plan view of the integrated circuit chip in FIG. 8.

FIG. 8 is a schematic diagram illustrating the structure of an integrated circuit chip in some embodiments according to the present disclosure. FIG. 9 is a plan view of the integrated circuit chip in FIG. 8. Referring to FIG. 8 and FIG. 9, the integrated circuit chip 7 includes a plurality of second bonding pads 8. Optionally, the plurality of second bonding pads 8 are on one side of the integrated circuit chip 7.

Figure 10:
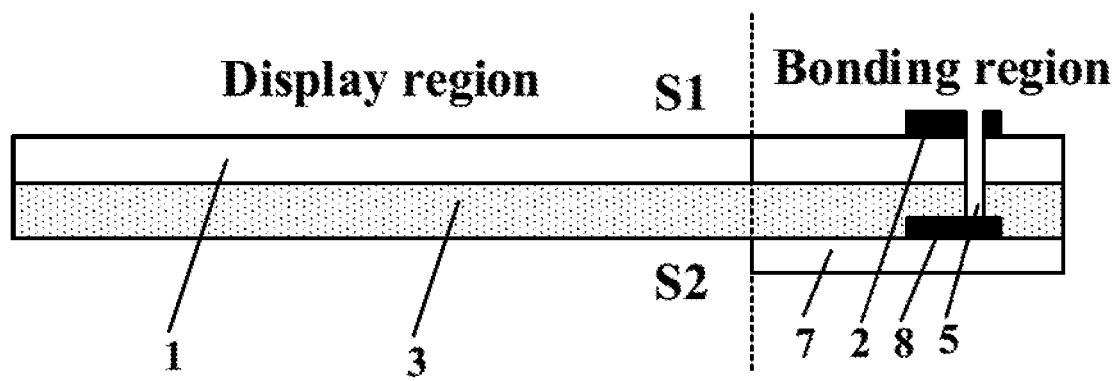
FIG. 10 illustrates a process of attaching an integrated circuit chip in a bonding region of a display panel in some embodiments according to the present disclosure.

FIG. 10 illustrates a process of attaching an integrated circuit chip in a bonding region of a display panel in some embodiments according to the present disclosure. Referring to FIG. 10, subsequent to removing the protective film, the integrated circuit chip 7 having a plurality of second bonding pads 8 is disposed on the second side S2 of the display panel 1. Specifically, the integrated circuit chip 7 is placed on the display panel 1 in a way so that the plurality of second bonding pads 8 are on a side of the optical film 3 distal to the display panel 1, e.g., the plurality of second bonding pads 8 are on a side of the integrated circuit chip 7 proximal to the optical film 3. Optionally, an orthographic projection of each of the plurality of first bonding pads 2 on the display panel 1 at least partially overlaps with an orthographic projection of one of the plurality of second bonding pads 8 on the display panel 1. Optionally, the plurality of first bonding pads 2 and the plurality of second bonding pads 8 have a one-to-one corresponding relationship. Optionally, the plurality of second bonding pads 8 are in direct contact with the optical film 3.

Optionally, the method further includes, subsequent to disposing the integrated circuit chip 7 having a plurality of second bonding pads 8 on the second side S2 of the display panel, aligning the plurality of first bonding pads 2 and the plurality of second bonding pads 8 with each other so that the orthographic projection of each of the plurality of first bonding pads 2 on the display panel 1 at least partially overlaps with the orthographic projection of one of the plurality of second bonding pads 8 on the display panel 1. Optionally, the orthographic projection of each of the plurality of first bonding pads 2 on the display panel 1 substantially overlaps with the orthographic projection of one of the plurality of second bonding pads 8 on the display panel 1. Optionally, the orthographic projection of each of the plurality of first bonding pads 2 on the display panel 1 substantially covers the orthographic projection of one of the plurality of second bonding pads 8 on the display panel 1. Optionally, the orthographic projection of each of the plurality of second bonding pads 8 on the display panel 1 substantially covers the orthographic projection of one of the plurality of first bonding pads 2 on the display panel 1.

In some embodiments, the orthographic projection of each of the plurality of first bonding pads 2 on the display panel 1 at least partially overlaps with the orthographic projection of one of the plurality of second bonding pads 8 on the display panel 1, thereby forming an overlapping region. Optionally, each of the pro-designated positions for forming the plurality of vias 5 is at least partially in the overlapping region. Optionally, each of the pre-designated positions for forming the plurality of vias 5 is in the overlapping region, and adjacent to an edge of the overlapping region. Optionally, one or more of the pre-designated positions for forming the plurality of vias 5 is entirely in the overlapping region (see, e.g., FIG. 6A). Optionally, each of the pre-designated positions for forming the plurality of vias 5 is in the overlapping region, and directly abuts an edge of the overlapping region (see, e.g., FIG. 6B). Optionally, each of the pre-designated positions for forming the plurality of vias 5 is outside the overlapping region, and directly abuts an edge of the overlapping region (see, e.g., FIG. 6C).

Figure 11A:
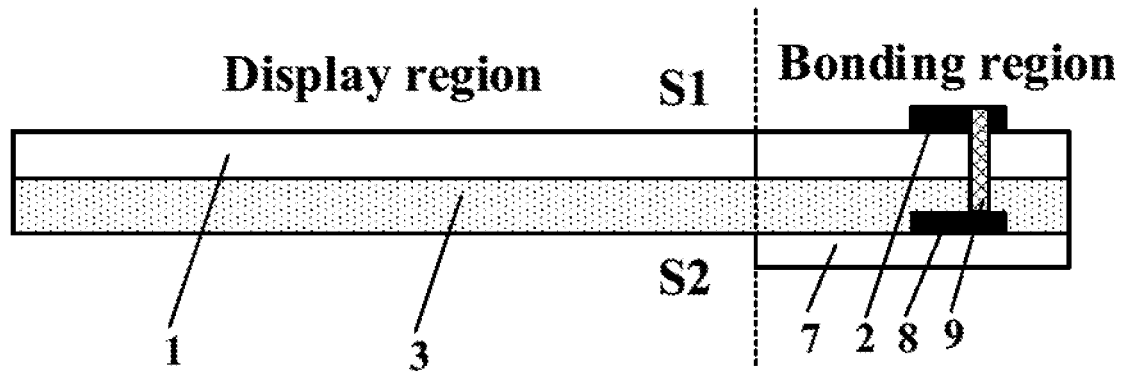
FIG. 11A illustrates a process of bonding an integrated circuit chip to a display panel in some embodiments according to the present disclosure.
Figure 11B:
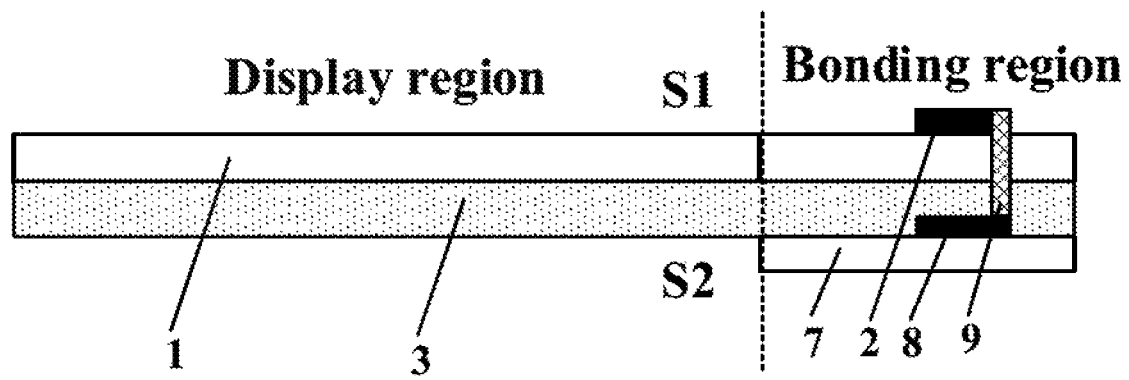
FIG. 11B illustrates a process of bonding an integrated circuit chip to a display panel in some embodiments according to the present disclosure.
Figure 11C:
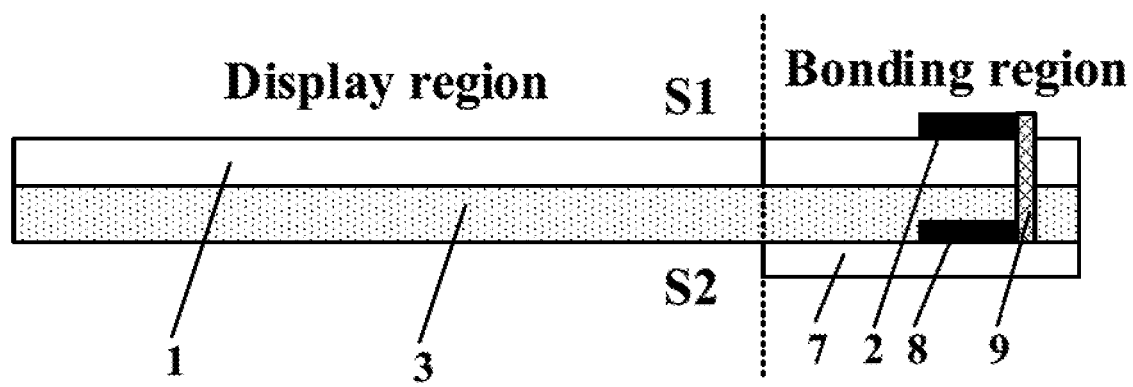
FIG. 11C illustrates a process of bonding an integrated circuit chip to a display panel in some embodiments according to the present disclosure.

FIG. 11A illustrates a process of bonding an integrated circuit chip to a display panel in some embodiments according to the present disclosure. The structure of the assembly of the integrated circuit chip and the display panel corresponds to that in FIG. 6A. FIG. 11B illustrates a process of bonding an integrated circuit chip to a display panel in some embodiments according to the present disclosure. The structure of the assembly of the integrated circuit chip and the display panel corresponds to that in FIG. 6B. FIG. 11C illustrates a process of bonding an integrated circuit chip to a display panel in some embodiments according to the present disclosure. The structure of the assembly of the integrated circuit chip and the display panel corresponds to that in FIG. 6C. Referring to FIGS. 11A to 11C, a plurality of connectors 9 are formed respectively in the plurality of vias. Each of the plurality of connectors 9 electrically connects one of the plurality of first bonding pads 2 and one of the plurality of second bonding pads 8.

In some embodiments, the step of forming the plurality of connectors 9 respectively in the plurality of vias includes sputtering a conductive material in the plurality of vias, thereby forming the plurality of connectors 9 respectively electrically connecting the plurality of first bonding pads 2 and the plurality of second bonding pads 8.

In some embodiments, the step of forming the plurality of connectors 9 respectively in the plurality of vias includes depositing a conductive material layer following by patterning the conductive material layer to form the plurality of connectors 9. Specifically, the step of patterning the conductive material layer in some embodiments includes forming a photoresist layer, exposing the photoresist layer with a mask plate, developing the exposed photoresist layer thereby forming a photoresist pattern, etching the conductive material layer in regions exposed by the photoresist pattern, and removing the photoresist layer, thereby forming the plurality of connectors 9 in the plurality of vias.

Optionally, the plurality of connectors 9 include a metallic material such as a metal or an alloy. Optionally, the metallic material is aluminum.

The plurality of first bonding pads 2 and the plurality of second bonding pads 8 include a conductive material such as a metal.

In the present method, the plurality of vias are first formed in a plurality of pre-designated positions prior to disposing the integrated circuit chip on the second side of the display panel, followed by forming the plurality of connectors respectively in the plurality of vias respectively electrically connecting the plurality of first bonding pads and the plurality of second bonding pads. Because the plurality of vias are formed prior to placing the integrated circuit chip on the display panel, obviating any damage to the integrated circuit chip caused by the via-forming process (e.g., using laser to form the plurality of vias).

In another aspect, the present disclosure provides a display apparatus having a display panel and an integrated circuit chip, wherein the integrated circuit chip is bonded to the display panel by a method described herein. Optionally, the display panel is a flexible display panel, and the display apparatus is a flexible display apparatus. Optionally, the display apparatus is a display apparatus with a narrow bezel or an extremely narrow bezel. Optionally, the display apparatus is a liquid crystal display apparatus. Optionally, the display apparatus is an organic light emitting diode display apparatus. Optionally, the display apparatus is an electrophoretic display apparatus. Examples of touch display apparatuses include, but are not limited to, an electronic paper, a mobile phone, a tablet computer, a television, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of bonding an integrated circuit chip to a display panel, comprising:
    forming a plurality of first bonding pads in a bonding region on a first side of the display panel;
    forming a plurality of vias extending through the display panel in the bonding region;
    subsequent to forming the plurality of vias, disposing an integrated circuit chip having a plurality of second bonding pads on a second side of the display panel substantially opposite to the first side, the plurality of second bonding pads being on a side of the integrated circuit chip proximal to the display panel;
    electrically connecting the plurality of first bonding pads respectively with the plurality of second bonding pads by forming a plurality of connectors respectively in the plurality of vias;
    prior to forming the plurality of vias, forming an optical film on a second side of the display panel substantially opposite to the first side;
    subsequent to forming the optical film, forming a protective film on a side of the optical film distal to the display panel; and
    subsequent to forming the plurality of vias, removing the protective film from the optical film;
    wherein the plurality of vias are formed to extend through the display panel and the optical film in the bonding region.

2. The method of claim 1, wherein the one or more of the plurality of vias extends through one of the plurality of first bonding pads.

3. The method of claim 1, wherein the one or more of the plurality of vias directly abut an edge of one of the plurality of first bonding pads.

4. The method of claim 1, wherein one or more of the plurality of vias extend through the display panel and the optical film in the bonding region, and at least partially extend into the protective film.

5. The method of claim 1, wherein, prior to forming the plurality of vias, an orthographic projection of each of the plurality of first bonding pads on the display panel at least partially overlaps with an orthographic projection of one of the plurality of second bonding pads on the display panel, thereby forming an overlapping region.

6. The method of claim 5, wherein each of the plurality of vias are formed at least partially in the overlapping region.

7. The method of claim 6, wherein each of the plurality of vias are formed at least partially in the overlapping region, and adjacent to an edge of the overlapping region.

8. The method of claim 6, wherein each of the plurality of vias are formed at least partially in the overlapping region, and directly abutting an edge of the overlapping region.

9. The method of claim 5, wherein each of the plurality of vias are formed outside the overlapping region, and directly abutting an edge of the overlapping region.

10. The method of claim 1, wherein forming the plurality of vias are performed by laser perforation.

11. The method of claim 1, wherein forming the plurality of connectors respectively in the plurality of vias are performed by sputtering a conductive material in the plurality of vias.

12. The method of claim 1, subsequent to disposing the integrated circuit chip having the plurality of second bonding pads on the second side of the display panel, further comprising aligning the plurality of first bonding pads and the plurality of second bonding pads with each other so that an orthographic projection of each of the plurality of first bonding pads on the display panel at least partially overlaps with an orthographic projection of one of the plurality of second bonding pads on the display panel.

13. The method of claim 1, wherein an orifice of at least one of the plurality of vias on the first side is surrounded by one of the plurality of first bonding pads.

14. The method of claim 1, wherein an orifice of one of the plurality of vias on the first side directly abuts one of the plurality of first bonding pads.

15. The method of claim 1, wherein the integrated circuit chip is a chip-on-film.

16. A display apparatus, comprising a display panel and an integrated circuit chip bonded to the display panel according to a method of claim 1.

17. The display apparatus of claim 16, wherein the display apparatus is a flexible display apparatus.

18. The display apparatus of claim 17, wherein the integrated circuit chip is a chip-on-film.

* * * * *